US006538297B2

United States Patent
Odagawa et al.

(10) Patent No.: US 6,538,297 B2
(45) Date of Patent: Mar. 25, 2003

(54) MAGNETO-RESISTIVE DEVICE AND MAGNETO-RESISTIVE EFFECT TYPE STORAGE DEVICE

(75) Inventors: Akihiro Odagawa, Nara (JP); Hiroshi Sakakima, Kyoto (JP); Kiyoyuki Morita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/804,867

(22) Filed: Mar. 13, 2001

(65) Prior Publication Data

US 2001/0021124 A1 Sep. 13, 2001

(30) Foreign Application Priority Data

Mar. 13, 2000 (JP) ........................................ 2000-068310
Oct. 30, 2000 (JP) ........................................ 2000-330253

(51) Int. Cl.$^7$ ............................................... H01L 43/00
(52) U.S. Cl. ..................... 257/421; 257/422; 257/25; 365/171; 365/158
(58) Field of Search ................................ 257/421, 422, 257/25, 30; 365/171, 173, 230.7, 158

(56) References Cited

U.S. PATENT DOCUMENTS

| | | | |
|---|---|---|---|
| 5,640,343 A | | 6/1997 | Gallagher et al. |
| 5,734,605 A | | 3/1998 | Zhu et al. |
| 5,793,697 A | * | 8/1998 | Scheuerlein ........... 365/230.07 |
| 5,838,608 A | | 11/1998 | Zhu et al. |
| 5,852,574 A | * | 12/1998 | Naji ........................... 365/158 |
| 5,936,882 A | * | 8/1999 | Dunn ........................ 365/158 |
| 6,130,835 A | * | 10/2000 | Scheuerlein ............... 365/171 |
| 6,169,689 B1 | * | 2/2001 | Naji ........................... 365/173 |
| 6,285,581 B1 | * | 9/2001 | Tehrani et al. ............. 365/173 |
| 6,331,944 B1 | * | 12/2001 | Monsma et al. ........... 365/171 |

FOREIGN PATENT DOCUMENTS

EP  0 936 622  8/1999

OTHER PUBLICATIONS

Leonard J. Schwee "Proposal on Cross–Tie Wall and Bloch Line Propagation in Thin Magnetic Films" Intermag Conference 1972, pp. 405–407.

(List continued on next page.)

*Primary Examiner*—David Nelms
*Assistant Examiner*—Thinh T. Nguyen
(74) *Attorney, Agent, or Firm*—Merchant & Gould P.C.

(57) ABSTRACT

A magneto-resistive device and a magneto-resistive effect type storage device are provided, which have improved selectivity and output signals by controlling bias to be applied. Two resistive devices are connected in series, and a magneto-resistive device is used for at least one of the resistive devices. When both of the resistive devices are magneto-resistive devices, their magnetic resistance should be controlled independently from each other, and by allowing the first magneto-resistive device to include a nonmagnetic substance of an electrical insulator and the second magneto-resistive device to include a nonmagnetic substance of a conductive substance, the second magneto-resistive device is operated as a bias control device for controlling the characteristics of the first magneto-resistive device so as to control the voltage to be applied to the storage device. Furthermore, when the other resistive device is configured to be a varistor type device, bias from the non-selected storage device is suppressed to improve the selectivity of the storage device.

19 Claims, 13 Drawing Sheets

OTHER PUBLICATIONS

Pohm et al. "A high output mode for submicron M–R memory cells" IEEE Transactions on Magnetics, vol. 28, No. 5, Sep. 1992, pp. 2356–2358.

Baibich et al. "Giant Magnetoresistance of (001)Fe/(001)Cr Magnetic Superlattices" Physical Review Letters, vol. 61, No. 21 Nov. 1988, pp. 2472–2475.

Ranmuthu et al. "New Low Memory Modes with Giant Magneto–resistance Materials" IEEE Transactions on Magnetics, vol. 29, No. 6, Sep. 1993, pp. 2593–2595.

Dieny et al. "Spin–valve effect in soft ferromagnetic sandwiches" Journal of Magnetism and Magnetic Materials 93, 1991, pp. 101–104.

Sakakima et al. "Spin–valve effect in [{Co–Pt/Cu/Ni–Fe–Co}/Cu] Multilayers" Japanese Journal of Applied Physics, vol. 33, 1994, pp. 1668–1669.

Irie et al. "Spin–valve Memory Elements Using [{Co–Pt/Cu/Ni–Fe–Co}/Cu] Multilayers" Japanese Journal of Applied Physics, vol. 34 1995 pp. 415–417.

* cited by examiner

MAGNETO-RESISTIVE DEVICE AND MAGNETO-RESISTIVE EFFECT TYPE STORAGE DEVICE

FIELD OF THE INVENTION

The present invention relates to a storage device in which a magneto-resistive (hereinafter referred to as MR) effect is employed. In particular, the present invention relates to a magneto-resistive device and a magneto-resistive effect type storage device, which have high sensitivity and high density.

BACKGROUND OF THE INVENTION

A solid storage device using a MR film was proposed by L. J. Schwee, Proceedings of INTERMAG Conference IEEE Transactions on Magnetics Kyoto, (1972) pp. 405. Various types of MRAM (magnetic random access memory) including word lines as current lines for generating a magnetic field and sense lines using MR films for reading data have been proposed (A. V. Pohm et al., IEEE Transactions on Magnetics 28 (1992) pp. 2356.). Such memory devices use an NiFe film or the like exhibiting an anisotropic MR effect (AMR) having an MR change ratio of about 2%, and thus the level of an output needed to be improved.

It was found that an artificial lattice film formed of magnetic films exchange-coupled through a nonmagnetic film to each other shows a giant MR effect (GMR) (A. V Baibich et al., Physical Review Letter 61 (1988) pp. 2472), and an MRAM using a GMR film was proposed (K. T. Ranmuthu et al., IEEE Transactions on Magnetics 29 (1993) pp. 2593.). However, the GMR film formed of magnetic films antiferromagnetically exchange-coupled to each other exhibits a relatively large MR change ratio, but disadvantageously requires a larger magnetic field to be applied and thus requires a larger current for writing and reading information than an AMR film.

While the above-described GMR film is an exchange-coupling type, one exemplary type of non-coupling GMR film is a spin valve film. Examples of this non-coupling type GMR film are those using an antiferromagnetic film (B. Dieny et al. Journal of Magnetic Materials 93 (1991) pp. 101.) and those using a semi-hard magnetic film (H. Sakakima et al., Japanese Journal of Applied Physics 33 (1994) pp. L1668). These spin valve films require a magnetic field as small as that required by the AMR films and still exhibit a larger MR change ratio than the AMR film. This proposal relates to an MRAM of a spin valve type using an antiferromagnetic film or a hard magnetic film and indicates that this storage device performs a non-destructive read-out (NDRO) (Y. Irie et al., Japanese Journal of Applied Physics 34 (1995) pp. L415).

The nonmagnetic layer used for the above-described GMR films is a conductive film formed of Cu or the like. Tunneling GMR films (TMR: tunnel magneto-resistance) using an insulating film of $Al_2O_3$ or the like as the nonmagnetic film have actively been studied, and MRAMs using the TMR film also have been proposed. In particular, a TMR film, which has a relatively high impedance, is expected to provide a sufficiently large output.

In the case of arranging magneto-resistive devices and operating them as an MRAM, storage cells made up of magneto-resistive devices are selected by sorting out direct bit lines and word lines. Even if a TMR film having excellent device selectivity was used, there were paths that pass through unselected devices, which became equivalent to the state in which resistance was connected in parallel, so that MR of one device cannot be energized sufficiently as the output. Furthermore, in accordance with the increase of storage capacity, this problem causes the S/N ratio of the output to decrease.

SUMMARY OF THE INVENTION

To solve the conventional problems mentioned above, it is an object of the present invention to provide a magneto-resistive device and a magneto-resistive effect type storage device, which have improved selectivity and output signals.

To achieve the above object, the present invention provides a magneto-resistive device including a first resistive device and a second resistive device connected in series, wherein at least one selected from the first resistive device and the second resistive device is a magneto-resistive device.

Furthermore, the present invention provides a magneto-resistive effect type storage device including a first resistive device and a second resistive device connected in series, wherein at least one of the resistive devices selected from the first resistive device and the second resistive device is a magneto-resistive device, and the magneto-resistive device as a single storage device is arranged two-dimensionally or three-dimensionally in plurality.

In the following description, the terms "device" and "element" are used under the same concept and will be unified in the term "device".

According to the present invention, an effective magneto-resistive effect type storage device capable of controlling the bias applied to the magneto-resistive device can be achieved, which has excellent selectivity of magnetic storage cells when arranged in lines for constructing an MRAM, and which suppresses the deterioration of the S/N ratio even if the densification of the storage capacity is promoted.

DESCRIPTION OF THE PREFERRED EMBODIMENTS

Figure 1:
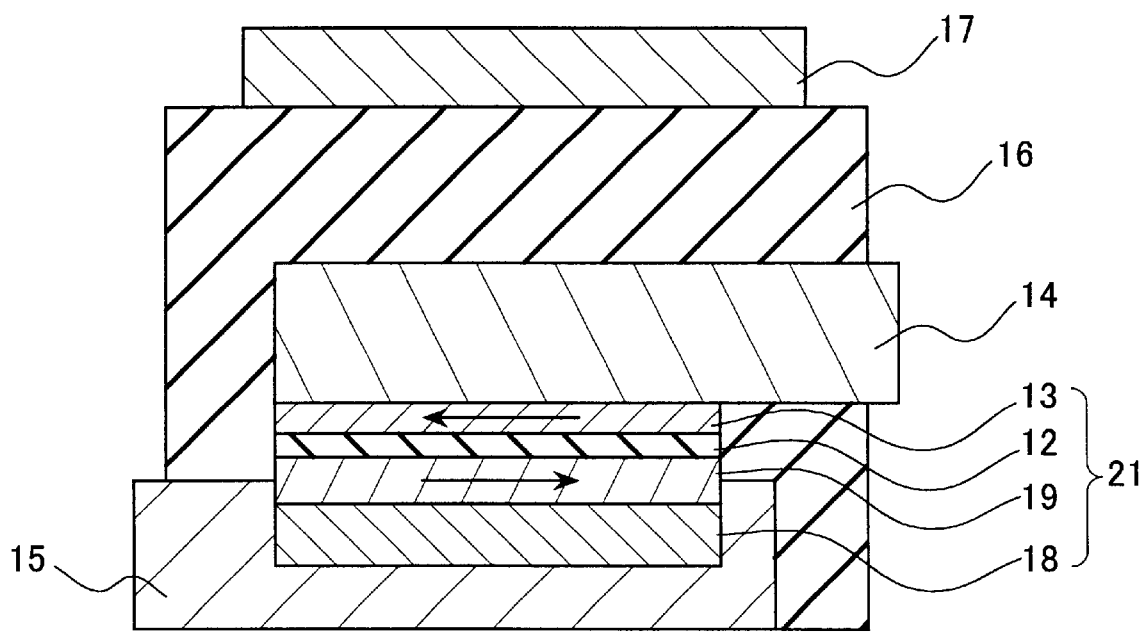
FIG. 1 is a sectional diagram of a storage device according to one embodiment of the present invention.

The present invention is configured such that at least one of two resistive devices is a magneto-resistive device and the other is either a magneto-resistive device or a resistive device having nonlinear current-voltage characteristics. In this configuration, both devices are connected in series, and bias controllability is added to the magneto-resistive device. As this kind of resistive device having nonlinear current-voltage characteristics, it is preferable to use a varistor type device or at least one device with an operation principle selected from an interband tunnel effect, a resonance tunnel effect, a single electron tunnel effect and a Josephson effect. When the two resistive devices used are both magneto-resistive devices, by controlling the magnetic resistance independently from each other according to the magnetization direction of the ferromagnetic substance included in the magneto-resistive device, one can be operated as a storage device and the other as a bias control device. In this configuration, it is preferable that one of the magneto-resistive devices includes a nonmagnetic substance selected from a conductive substance, a semiconductor and an electrical insulator, and that the other magneto-resistive device includes a nonmagnetic substance selected from a conductive substance and a semiconductor. The magneto-resistive device of the latter is operated as a bias control device for controlling the property of the magneto-resistive device of the former, so that the selectivity of the magnetic storage device included herein can be improved.

Furthermore, in the configuration in which one is a magneto-resistive device and the other is a resistive device having nonlinear current-voltage characteristics, by designing and creating the voltage at reference current for a varistor type device or the gap voltage for a tunnel effect device to be of an optimum value, the selectivity of the magnetic storage device included herein can be improved. Here, the voltage at reference current and the gap voltage indicate a voltage point where the dynamic resistance of the nonlinear characteristics has the highest rate of change, and this voltage point is used as a threshold value also when using a resistive device having other nonlinear current-voltage characteristics.

Moreover, it is possible to improve a desired selective reading operation also by connecting the resistive device having nonlinear current-voltage characteristics arranged in the subsequent stage and the other magneto-resistive device parallel to each other and by raising or dropping the bias voltage of the magneto-resistive device according to the magneto-resistive effect with regard to the voltage at reference current or the gap voltage. It is preferable that the magneto-resistive device in this case includes a conductive substance, a semiconductor or an electrical insulator as the nonmagnetic substance. Furthermore, it is more preferable that the nonmagnetic substance is an electrical insulator, since the magneto-resistive effect is large.

In the following, the present invention will be explained by referring to the drawings.

FIG. 1 is a sectional diagram showing a spin valve type storage device using an antiferromagnetic film (or a magnetized rotation control film). A ferromagnetic film (M) 19 in a MR device part is exchange-coupled to an antiferromagnetic film (AF) 18, and the ferromagnetic film (M) 19 forms a fixed layer. Due to a magnetic field generated by an electric current of a word line 17 and/or by an electric current of a sense line or a bit line (14, 15), a free layer 13, for which a soft magnetic film is mainly used, performs a magnetization rotation, and the storage state is maintained by the magnetization direction against the ferromagnetic film (M) 19 (the fixed layer). In FIG. 1, 12 is a nonmagnetic electrical insulating film (NM); 14 and 15 are conductive films forming either a sense line or a bit line; and 16 is an insulating film (I) inserted between the layers.

Figure 2A:
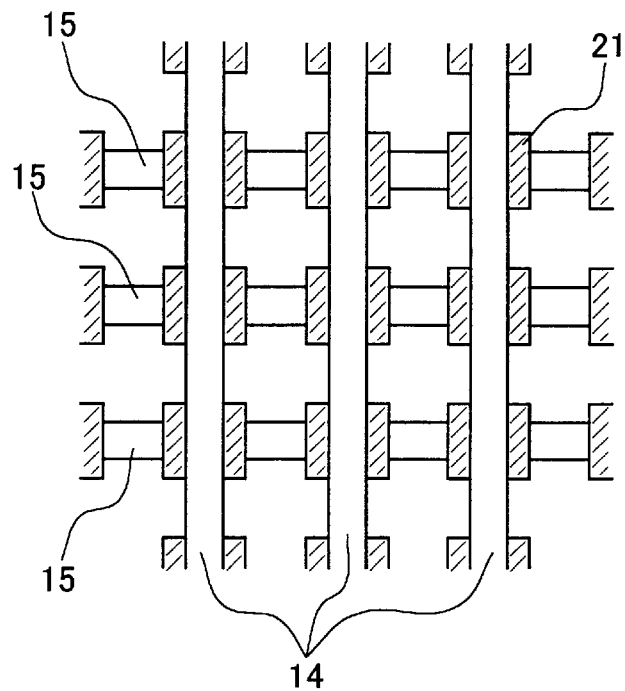
FIGS. 2A and 2B are basic diagrams of a storage device according to one embodiment of the present invention.

These MR devices are arranged in lines as illustrated in FIG. 2A to obtain a MRAM device. In other words, a magneto-resistive effect type storage device 21 is arranged in lines and connected in the form of a lattice by the conductive films 14, 15. Here, although the conductive film (the word line) 17 is overlapping the conductive film 14 in this arrangement, the conductive film is omitted in FIG. 2A.

Figure 2B:
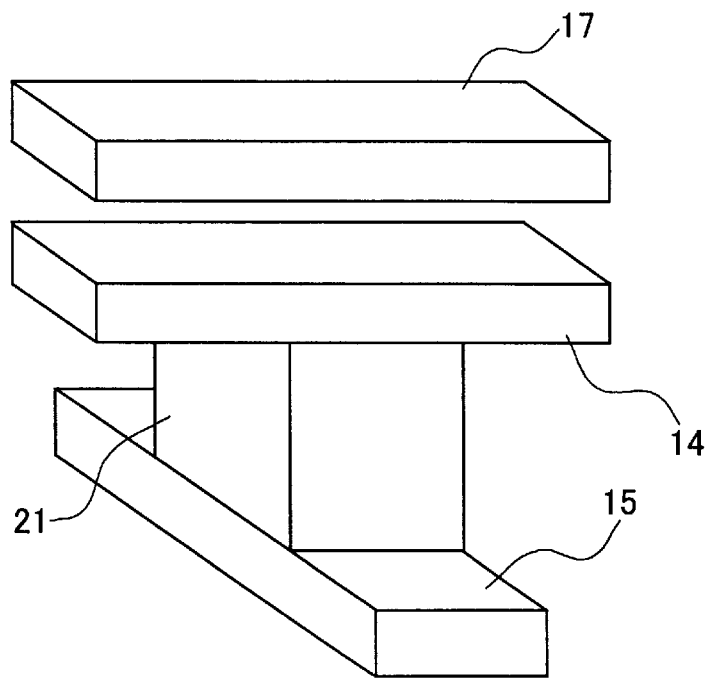

FIG. 2B is a perspective view of FIG. 2A. The conductive film (the word line) 17 is arranged parallel to the conductive film 14 in an electrically insulated state.

The magneto-resistive effect type storage device 21 is positioned on an intersection point of the conductive films 14, 15 and is arranged by abutting top and bottom on the conductive films 14, 15, and the conductive film (the word line) 17 is arranged such that the magnetic field can be applied most effectively to the magneto-resistive effect type storage device 21. The drawing shows the case in which the conductive film 17 is arranged right above the magneto-resistive effect type storage device 21.

In the case where the conductive film 17 is arranged almost right above the magneto-resistive effect type device 21 as shown in FIG. 2B, for applying a magnetic field effectively to the free layer 13, that is, the storage cell of the magneto-resistive effect type storage device 21 by using the conductive film (the word line) 17, it is preferable that the distance between the free layer 13 and the conductive film (the word line) 17 is approximately not more than 500 nm. In the case where the current density applied to the conductive film (the word line) 17 is determined to be not more than $1 \times 10^7 A/cm^2$, it is more preferable that the distance between the free layer 13 and the conductive film (the word line) 17 is approximately not more than 300 nm.

The reading of the content stored in the magneto-resistive effect type storage device 21 is performed by using the conductive films 14, 15, i.e. the sense line and the bit line, and by monitoring the change in the resistance value of the magneto-resistive effect type storage device 21. At this time, there are two ways of monitoring, in which the resistance change is monitored as a voltage change under an applied constant current and in which the resistance change is monitored as a current change under an applied low voltage. The monitoring system is selected suitably between them for each use by considering the simplicity of constructing a circuit etc.

Figure 3:
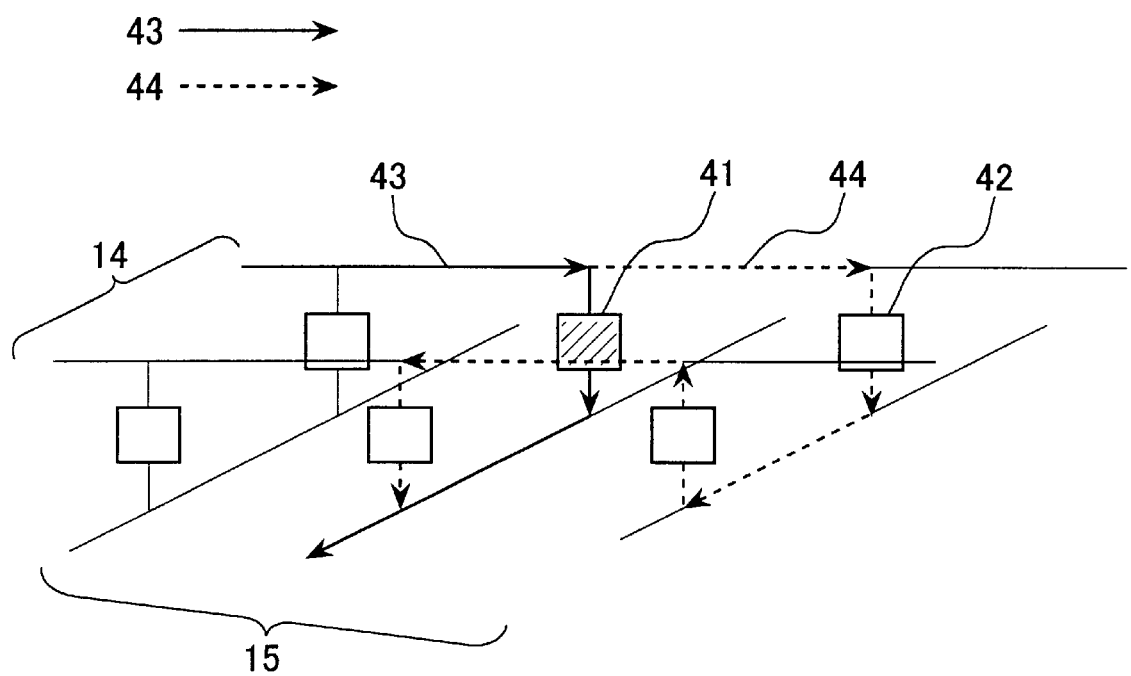
FIG. 3 is a diagram showing the principle of operation of a magneto-resistive type storage device according to one embodiment of the present invention.

However, if the devices are only connected in series, the deterioration with regard to the selectivity of the storage device cannot be avoided, and the S/N ratio is reduced. A thick full line 43 in FIG. 3 shows a bias line running via selected devices, and a thick broken line 44 is an example of a bias line running via non-selected devices. When the non-selected bias lines are connected in parallel in such a way, as the storage capacity increases, the deterioration of the S/N is even more notable in the MRAM device.

In the present invention, this problem was solved by the configuration of connecting two pieces of a magneto-resistive device in series with a nonmagnetic substance inserted between ferromagnetic substances and controlling the magnetic resistance of the devices independently from each other. In other words, one of the magneto-resistive devices is the first magneto-resistive device in which the nonmagnetic substance is an electrical insulator, and the other magneto-resistive device is the second magneto-resistive device in which the nonmagnetic substance is a conductive substance, so that the second magneto-resistive device can be operated as a bias control device for controlling the property of the first magneto-resistive device, which makes it possible to improve the S/N ratio of the MRAM device.

Furthermore, by connecting a magneto-resistive device and a resistive device having nonlinear current-voltage characteristics in series and by determining a bias applied to the selected storage device to be higher than a bias applied to the circumference by using the strong nonlinearity of the nonlinear resistive device, the S/N ratio of the MRAM device can be improved.

In addition, by arranging the devices in which the second magneto-resistive device and the nonlinear resistive device are combined parallel to each other in the subsequent stage of the first magneto-resistive device acting as the storage cell, and by determining the above characteristic voltage to be in the range within the magneto-resistive change obtained by the second magneto-resistive device by using the switching property arising from the strong nonlinearity of the nonlinear device, the second magneto-resistive device can be operated as a bias control device for controlling the property of the first magneto-resistive device, which makes it possible to improve the S/N of the MRAM device.

Figure 4A:
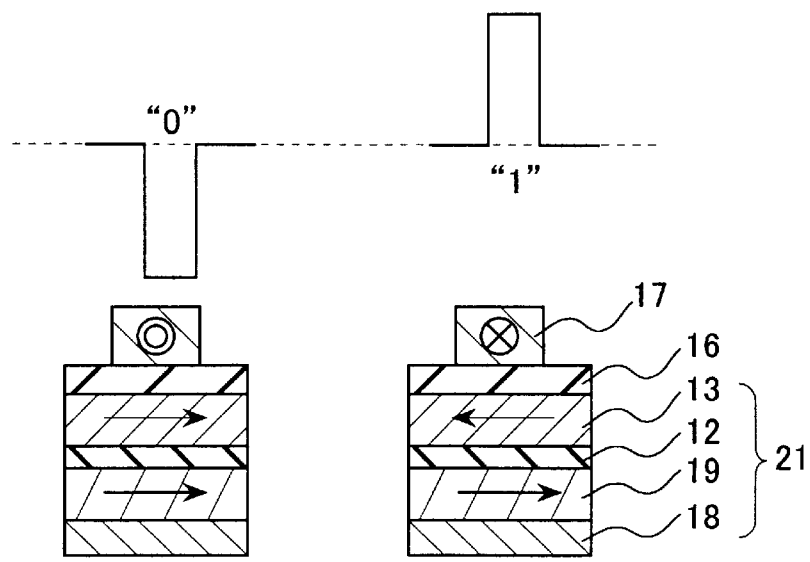
FIGS. 4A, 4B and 4C are diagrams showing the principle of operation of a storage device according to one embodiment of the present invention.

FIG. 4A shows the principle of operation of an AF spin valve type storage device. The ferromagnetic film (M) 19, which is a fixed layer, is exchange-coupled to the AF layer 18, and the magnetization is pinned in one direction. By changing the current direction applied to the word line (W)17 and magnetizing the free layer 13 in different directions, "1" and "0" are recorded.

Figure 4B:
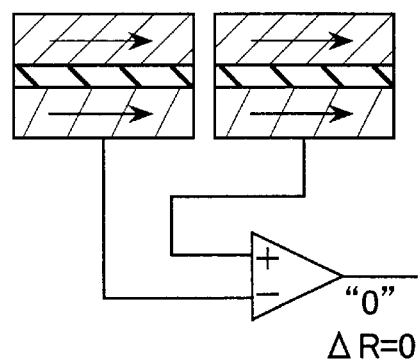
Figure 4C:
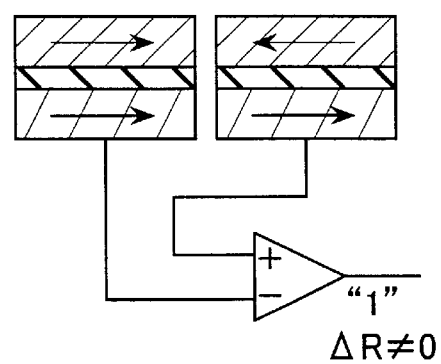

For reading a selected storage, by measuring the resistance difference with a proper reference resistive device, it is identified as either "1" or "0". In other words, in the case of FIG. 4B, since the resistance difference is 0, it is identified as "0", whereas in the case of FIG. 4C, since the resistance difference is not 0, it is identified as "1". Here, the state of "1" and "0" was specified for a practical reason, but the opposite is also fine without question. As the reference resistance in this case, it is preferable to use a resistance of about the same degree as the magneto-resistive device configuring the storage device, and as illustrated in FIG. 4B and FIG. 4C, the magneto-resistive device itself may be used as the reference resistance.

The present embodiment shows an example of employing the AF layer 18 to use the ferromagnetic film 19 as the fixed layer, but the ferromagnetic layer 19 may be used as the storage layer in the magneto-resistive device formed by using the difference in the coercivity between the ferromagnetic layer 19 and the soft magnetic film layer 13 without using the AF layer 18. In the case of such a device, the coercivity ($H_{C2}$) of the ferromagnetic layer 19 is determined to be larger than that ($H_{C1}$) of the soft magnetic film layer 13.

Also, the storage write is performed with $H>H_{C2}$ (alternatively $H<-H_{C2}$), and the read-out is performed by applying a magnetic field in the range of $H_{C2}>H>H_{C1}$ (alternatively $-H_{C1}>H>-H_{C2}$). At this time, it is possible to perform a read-out in a non-destructive storage state by applying the magnetic field in the negative and positive direction in the range of $H_{C2}>H>H_{C1}$, $-H_{C1}>H>-H_{C2}$, reversing the magnetization direction of the soft magnetic film 13 and monitoring the value of the magneto-resistive change against the ferromagnetic film 19. Thus, the present invention may be realized by this configuration.

The principle of operation with regard to a device of 1 bit was explained above. To construct an actual storage device, however, these devices need to be arranged in lines as illustrated in FIG. 2A. In this case, with regard to each device, for example, by using two word lines crossing perpendicular to each other in the vicinity of the device in the (N, M) address, or by using a sense line (or a bit line) and a word line also arranged so as to cross perpendicular to each other, or by using a sense line and a bit line, a combined magnetic field is generated, so that information can be written, and the write selectivity can be improved.

Furthermore, for reading, the magneto-resistive device and the magneto-resistive control device of the present invention respectively may be arranged parallel to each other on points where a group of sense lines and a group of bit lines intersect, and by selecting the sense line in the line N and the bit line in the row M by addressing signals, the storage cell in the (N, M) address can be selected. At this time, to achieve efficient transmission of the signal pulses, the device of the present invention that controls the magnetic resistance is useful particularly in preventing signal pulses from flowing in via other paths or in improving the transmission efficiency of even accelerations of signal pulses.

As the free layer 13 of the magneto-resistive device illustrated in FIG. 1, a Ni—Co—Fe alloy is suitable in general. With regard to an atomic composition ratio of a Ni—Co—Fe film, it is desirable to use a Ni-rich soft magnetic film of formula

in which $0.6 \leq x \leq 0.9$ $0 \leq y \leq 0.4$ $0 \leq z \leq 0.3$ or a Co-rich film of formula

in which $0 \leq x' \leq 0.4$ $0.2 \leq y' \leq 0.95$ $0 \leq z' \leq 0.5$

The above composed films have the low magnetostrictive property (of not less than $1 \times 10^{-5}$) required for a sensor or for a MR head.

Furthermore, the thickness of the free layer preferably is in the range between 1 nm and 10 nm. When the thickness is large, the MR ratio is reduced due to a shunt effect, but when the thickness is too small, the soft magnetic property is deteriorated. More preferably, the thickness should be in the range between 2 nm and 7 nm.

Figure 6A:
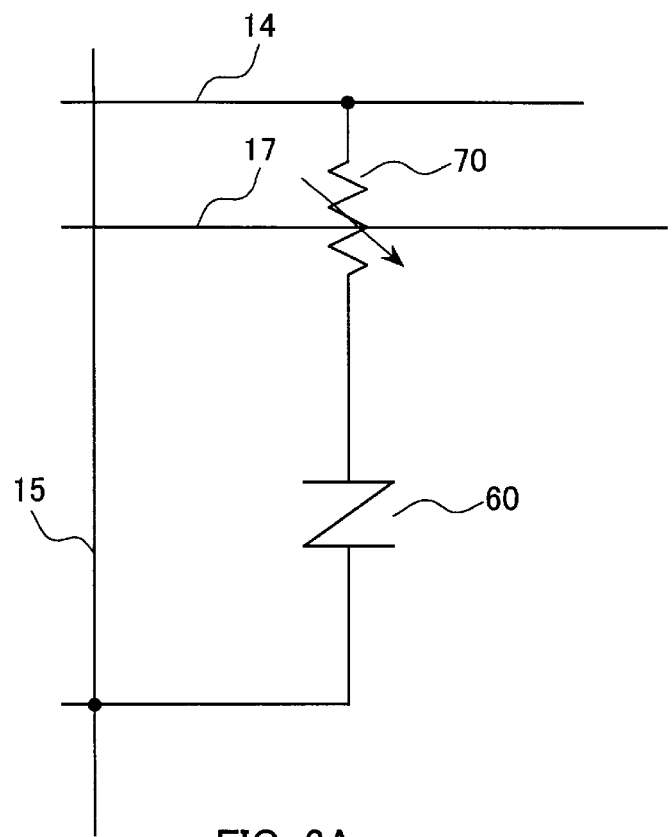
FIG. 6A is an equivalent circuit diagram of a storage device according to one embodiment of the present invention.

When magneto-resistive devices are arranged in lines to construct MRAM, as illustrated in FIG. 6A, it is preferable to connect a first magneto-resistive device 70 in series with a device 50, which is selected from a second magneto-resistive device, a nonlinear resistive device and a combination of both devices. More specifically, the conductive film 14 is connected in series to the first magneto-resistive device 70, the device 50, which is selected from a second magneto-resistive device, a nonlinear resistive device and a combination of both devices, and the conductive film 15. In addition, the resistance value of the first magneto-resistive device 70 is variable.

Figure 5A:
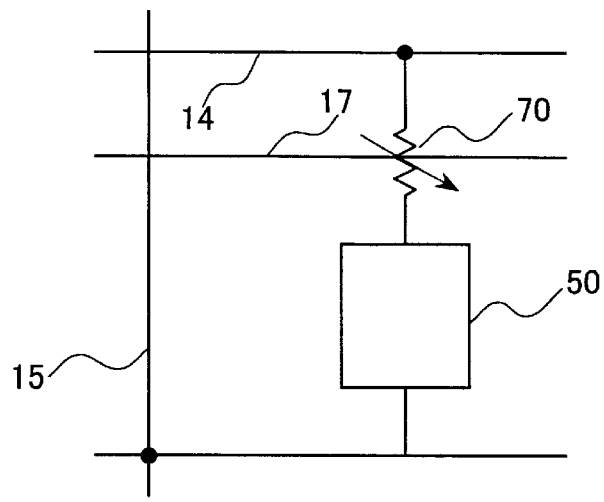
FIGS. 5A, 5B and 5C are schematic block diagrams of a storage device according to one embodiment of the present invention.
Figure 5B:
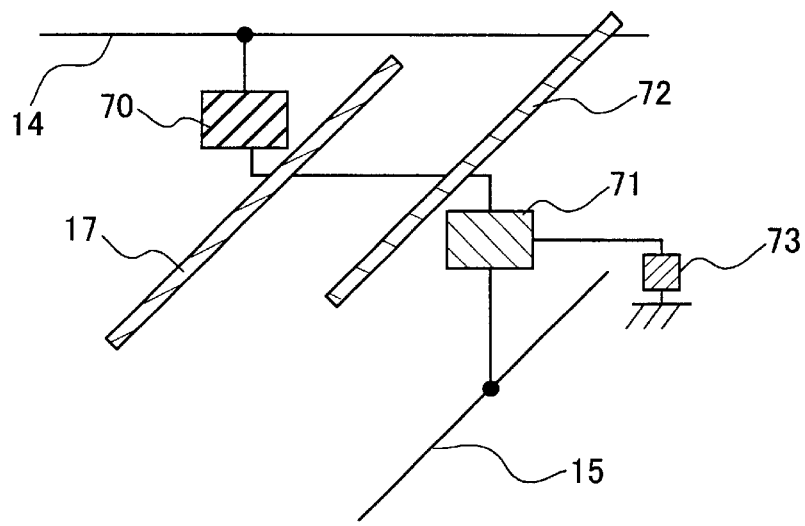

As described above, to obtain the selectivity of the storage cells, it is preferable to arrange, as illustrated in FIG. 5B, the first resistive device 70 and the second resistive device (NL) 71 that controls the property of the device in series. In FIG. 5B, the NL 71 is arranged in the lower part of the TMR device 70, but the NL 71 may be arranged in the upper part thereof.

Figure 5C:
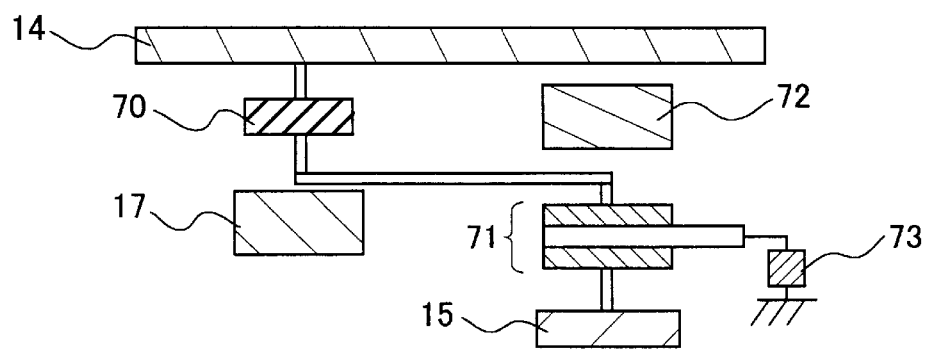

According to the present invention, it is preferable that the resistive device (NL) that controls the property of the device is a magneto-resistive device including a nonmagnetic conductive substance (or a semiconductor) inserted between ferromagnetic substances (a fixed layer and a free layer). In this case, the magneto-resistive device 71 is a non-tunnel type giant magneto-resistive (GMR) device. When an appropriate load device (for example, load resistance etc.) LR 73 is connected to this nonmagnetic conductive substance, a device illustrated in FIG. 5C is produced. In this case, when the magnetization directions of the two ferromagnetic substances 71 included in the NL are parallel to each other, the applied bias current flows toward the sense line, and when the directions are anti-parallel, a part of the bias current is split in the LR direction. This split current is generated by the operation of field switching that generates an impedance difference between the magneto-resistive device of NL and the LR device. The reduced portion of the bias flowing toward the sense part as a result of the above operation suppresses the effect of the portion of the parallel resistance that existed via the non-selected magneto-resistive devices. Thus, by using a magnetic storage device of a magneto-resistive type including the magneto-resistive device of the present invention, the S/N ratio of the MRAM device can be improved.

Furthermore, also in the MRAM device including a magneto-resistive device in which the magneto-resistive device 70 and a nonlinear resistance device 60 are connected in series as illustrated in FIG. 6A, the selectivity of storage cells can be improved.

Figure 6B:
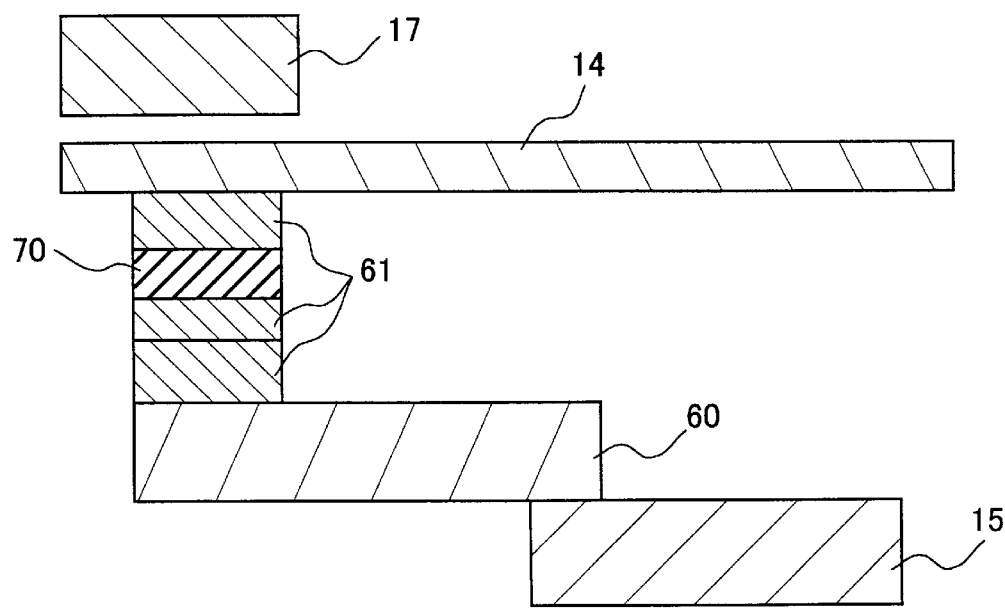
FIG. 6B is a schematic block diagram thereof.

FIG. 6B is a cross-sectional block diagram of an equivalent circuit shown in FIG. 6A. In other words, the conductive film (word line) 17 is provided in the upper part, and underneath this part, the conductive film 14, the conductive film (contact electrode) 61, the magneto-resistive device 70 inserted between the aforementioned conductive films (contact electrodes) 61, the nonlinear resistive device 60 and the conductive film 15 are laminated in series.

Here, with regard to the resistive device having nonlinear current-voltage characteristics, it is preferable to use a device having varistor type characteristics, or at least one device selected from an interband tunnel effect device, a resonance tunnel effect device, a single electron tunnel effect device and a Josephson effect device.

In other words, as illustrated in FIG. 3, when the nonlinear resistive device is produced such that the voltage applied to the part of the selected storage cells via the non-selected storage cells (see the part of the broken line 44) amounts to not more than the voltage at the reference current or the tunnel gap voltage, and that the applied voltage to the selected storage cells amounts to not less than the voltage at reference current or the tunnel gap voltage, the selectivity of storage cells can be improved, and it is possible to improve the S/N ratio of the MRAM device.

Figure 7:
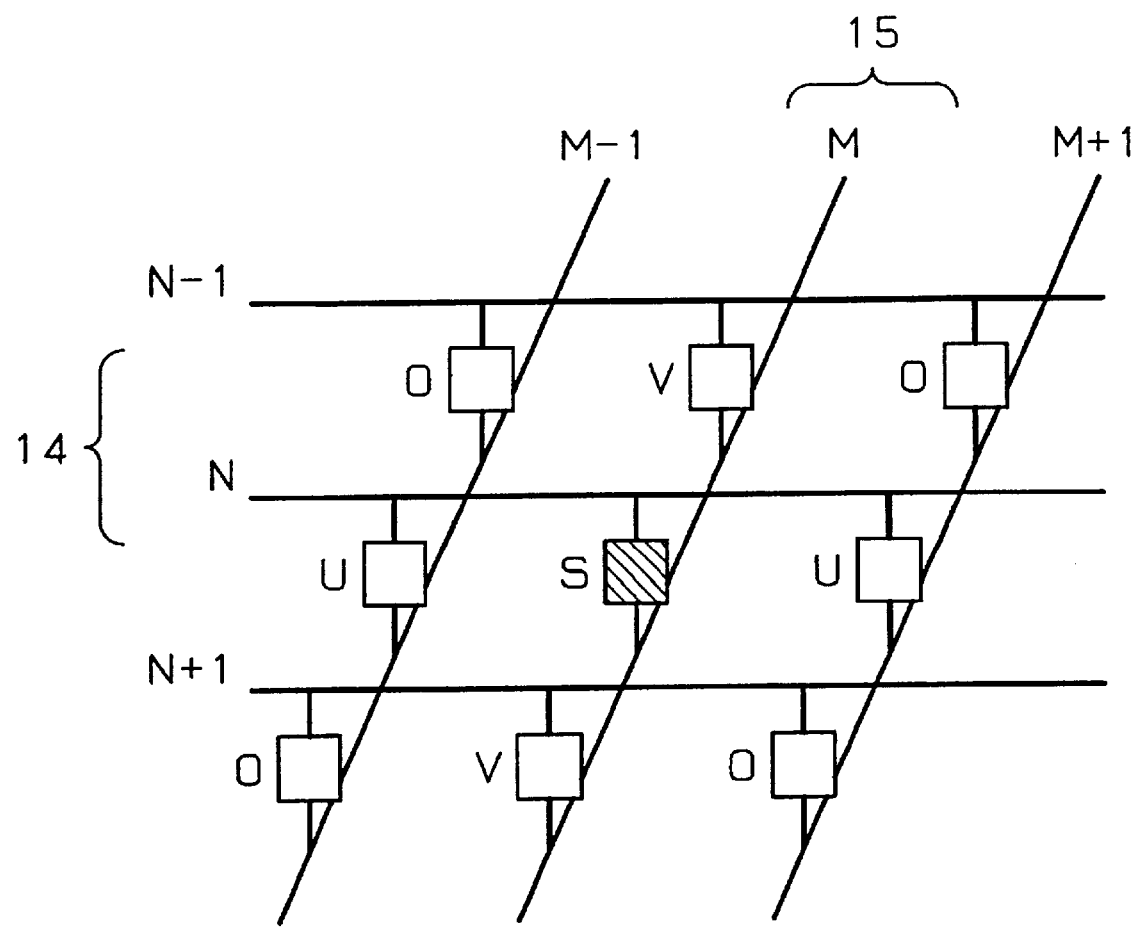
FIG. 7 is a schematic block diagram of a storage device according to one embodiment of the present invention.
Figure 10:
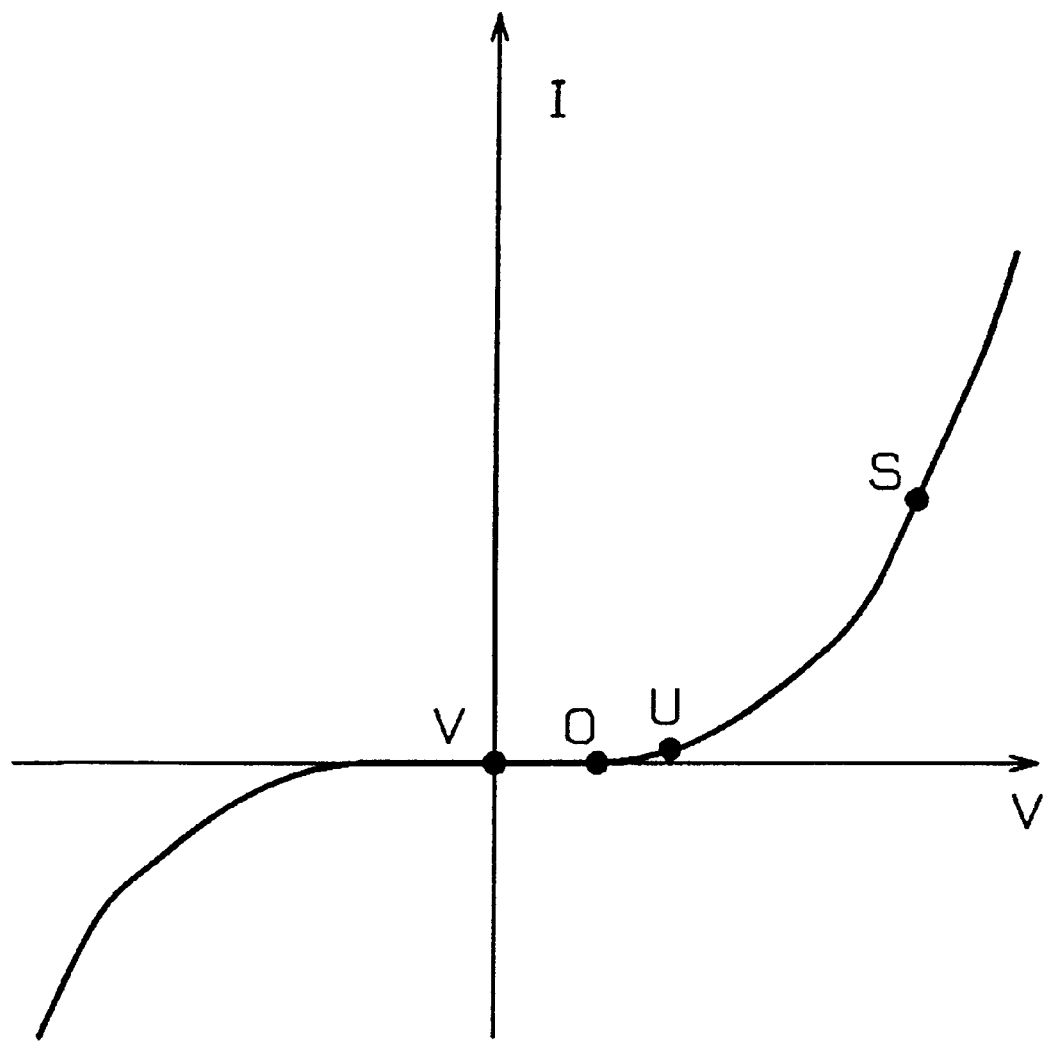
FIG. 10 is a graph showing basic characteristics of a storage device according to one embodiment of the present invention.

FIG. 7 shows a block diagram of a MRAM device including the magneto-resistive device of the present invention, and FIG. 10 shows one example of the electrical property of the magneto-resistive device of the present invention. As illustrated in FIG. 7, when the sense line 14 in the line N and the bit line 15 in the row M are selected and the selected device is biased to a point S, a group of devices lined up in the sense line of the N line except the one in the row M is biased to a point U, and a group of devices lined up in the row M except the one in the N line is biased to a point V, and the rest are biased respectively to a point O. At this time, the characteristic voltage Vb that shows the voltage at the reference current or the tunnel gap voltage etc. is determined as Vs>Vb, Vb>Vu, Vv, Vo, and the points other than the point S have not more than the characteristic voltage. Accordingly, the stored information only of the selected device can be taken out.

Figure 8:
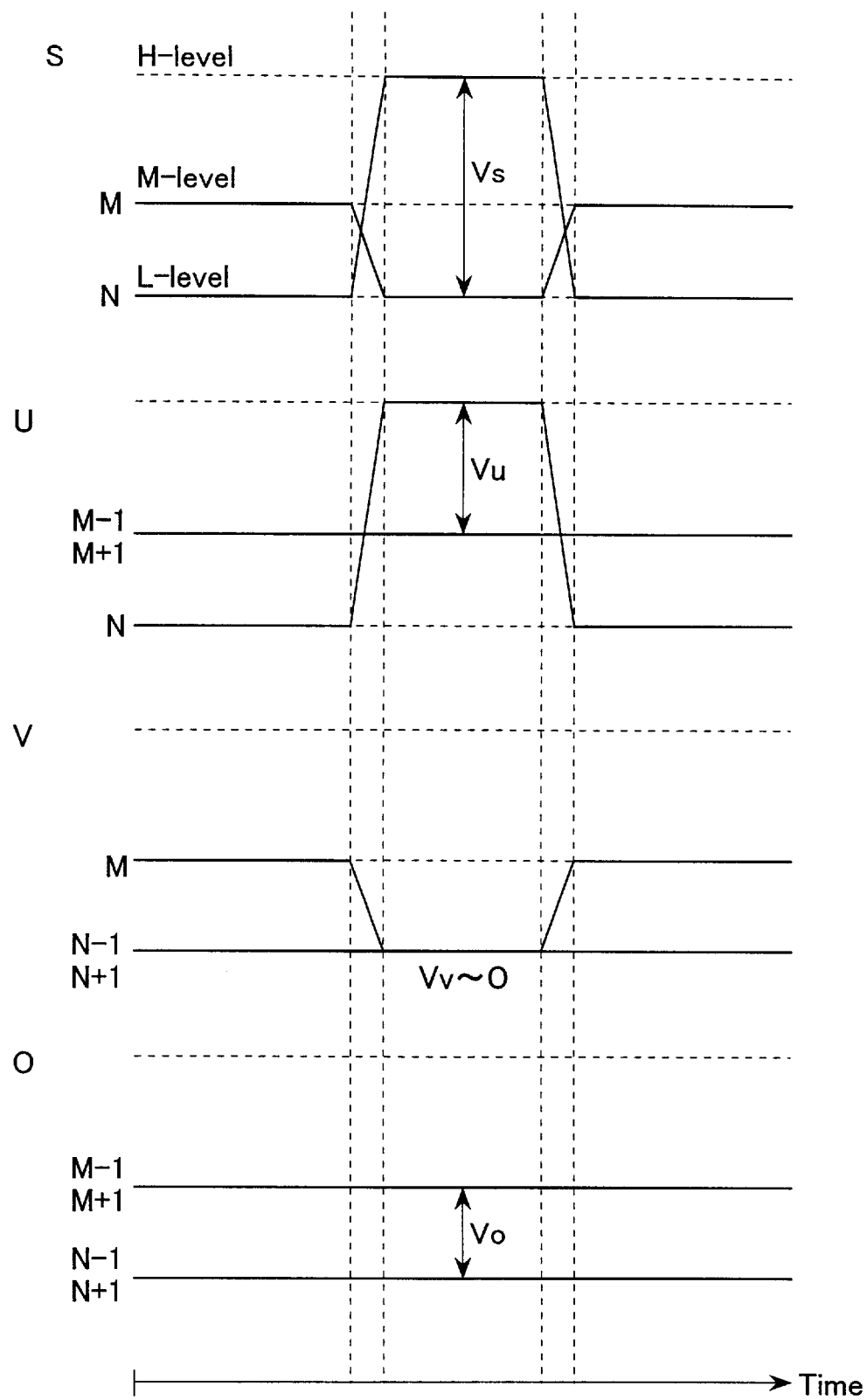
FIG. 8 is a diagram showing the principle of operation of a storage device according to one embodiment of the present invention.

Furthermore, as shown as timing charts of applied pulse biases in FIG. 8, by determining the bias level in three values, the effect of stabilizing the bias operation can be attained. The sense line in the case of non-selection is biased in the L-level, and the bit line in the case of non-selection is biased in the M-level. Also, the sense line in the case of selection is biased in the H-level, and the bit line in the case of selection is biased in the L-level. According to this operation, the reading operation of the device that is desired to be selected is possible. Moreover, when the bias difference between the H-level and the M-level is determined to be larger than the bias difference between the M-level and the L-level, the operation stability is improved. According to the example shown in FIG. 8, it becomes Vs>Vb>>Vu>Vo>Vv, and it is possible to read the selected storage cells.

Figure 11:
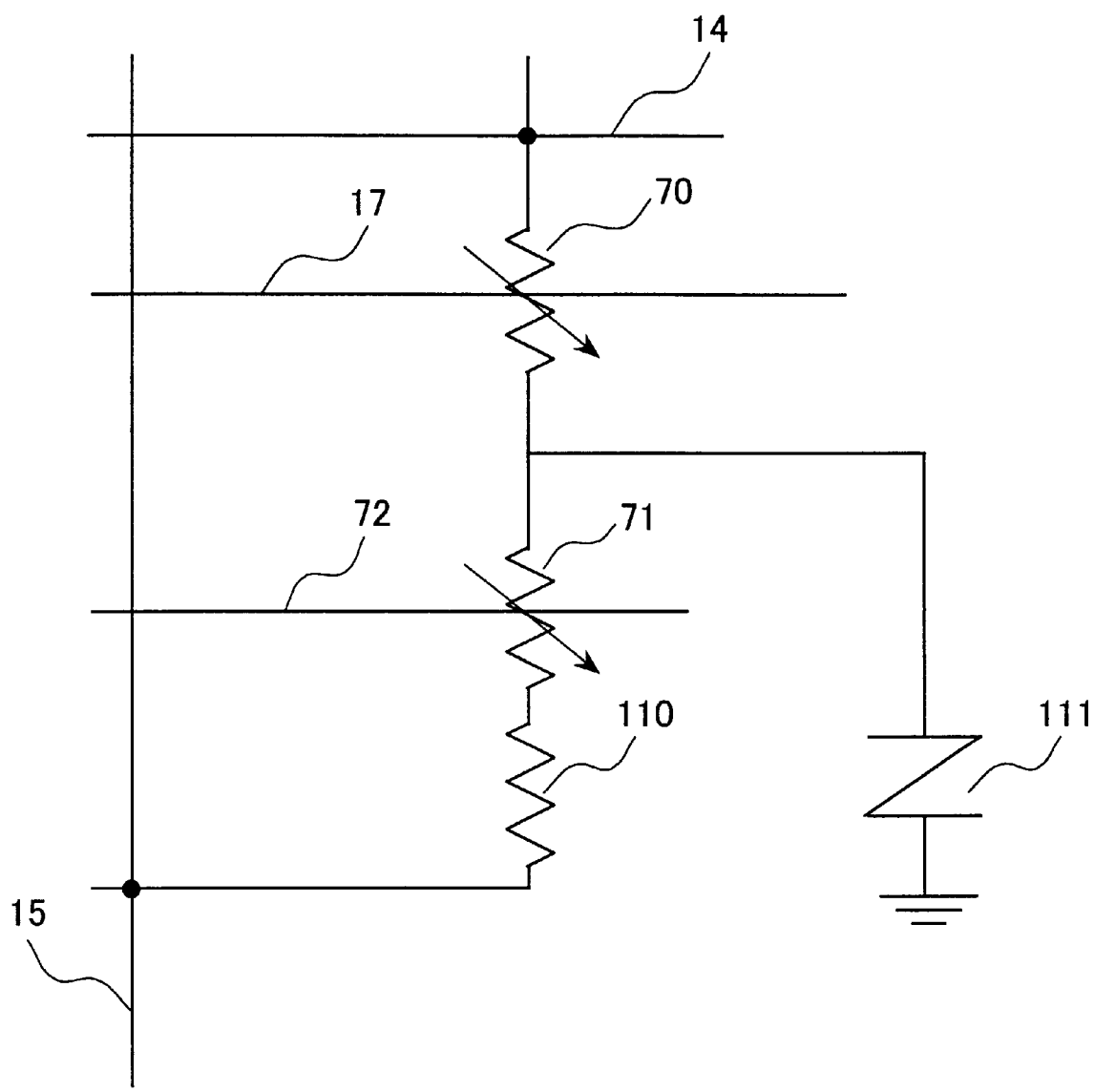
FIG. 11 is an equivalent circuit diagram of a storage device according to one embodiment of the present invention.
Figure 12:
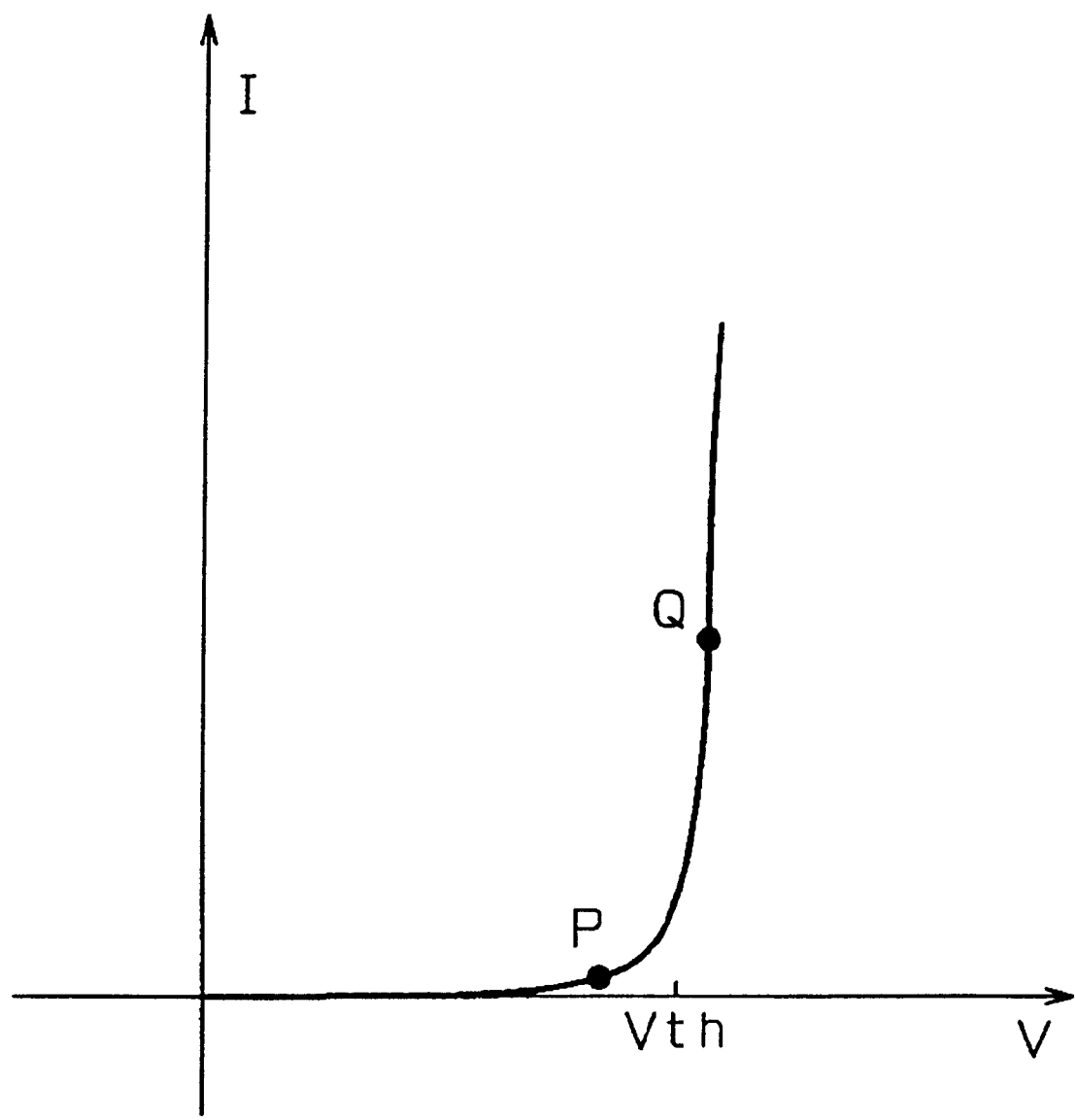
FIG. 12 is a graph showing basic characteristics of a storage device according to one embodiment of the present invention.

Moreover, as illustrated in FIG. 11, a storage device was constructed by arranging a device, which includes the second magneto-resistive device 71 and the nonlinear resistive device 111 combined parallel to each other, in the subsequent stage of the first magneto-resistive device 70. In this case, the switching property generated by the strong nonlinearity of the nonlinear device is employed, and the above characteristic voltage is determined to be in the range within the magneto-resistive change obtained by the second magneto-resistive device, so that the second magneto-resistive device is operated as the bias control device, and by splitting the output from the first magneto-resistive device, the reading of the storage can be switched between ON and OFF. FIG. 12 is a graph showing characteristics of the resistive device to be arranged in the subsequent stage. Under the condition in which a constant current is applied, a bias voltage point at the time when the second magneto-resistive device is in the low-resistance state is set to be a point P, and a bias voltage point at the time of high-resistance state is set to be a point Q. In the state in which the point P is biased, the nonlinear device connected in parallel has extremely larger resistance than the second magneto-resistive device. As a result, the electric current is output through the sense line 15. In the state in which the point Q is biased, the nonlinear device has a smaller resistance than the second magneto-resistive device, so that the electric current flows toward the nonlinear device and is terminated. Thus, the output to the sense line can be reduced greatly. At this time, the current split rate is directly dependent on the change of rate in the dynamic resistance $R_d$ of the nonlinear device. In the case where $R_d$ of the nonlinear device changes to about 10 times between the point P and the point Q, its split rate can be considered to be 10 times. In this way, as the rate of change in the dynamic resistance $R_d$ is determined to be larger, a speedy ON-OFF of the output is possible, and the selectivity for reading the storage device can be improved.

With regard to the metallic magnetic film for the fixed layer, materials such as Co, Fe and alloys of Co—Fe, Ni—Fe, Ni—Fe—Co are excellent. In particular, Co, Fe and a Co—Fe alloy are excellent in obtaining a high rate in MR, so that they are preferably used for the interface with the nonmagnetic layer.

Furthermore, XMnSb (here, X indicates Ni, Pt, Pd and Cu) has a high magnetic polarizability, and thus a high rate in MR can be obtained, so that XMnSb is preferably used for constructing a MR device.

As for an oxide magnetic film for the fixed layer, it is preferable to use $MFe_2O_4$ (M is one or more elements selected from Fe, Co and Ni). These elements show ferromagnetism up to a comparatively high temperature, and Co-rich and Ni-rich materials have much higher resistance than Fe-rich materials. Furthermore, since Co-rich material is characterized by the large magnetic anisotropy, a film with desired characteristics can be obtained by adjusting the composition ratios of these elements.

As for the AF layer (or the magnetized rotation control layer) abutting on the fixed layer, metal films of a disordered alloy type such as Ir—Mn, Rh—Mn, Ru—Mn, Cr—Pt—Mn or the like are available, which are advantageous in simplifying the process by forming the film in the magnetic field and thus enabling it to exchange-couple with the magnetic film. On the other hand, Ni—Mn, Pt—(Pd)—Mn etc. of a regular alloyed type need to be treated with heat because of its regularity, but they have excellent thermal stability. In particular, Pt—Mn is preferable.

With regard to the oxide film, it is preferable to use $\alpha$—$Fe_2O_3$ or NiO, or $LTO_3$ (L designates a rare earth element except Ce, and T designates Fe, Cr, Mn and Co).

As for the free layer, a Ni—Co—Fe alloy is suitable in general. With regard to an atomic composition ratio of a Ni—Co—Fe film, it is desirable to use a Ni-rich soft magnetic film of formula $$Ni_xCo_yFe_z$$

in which $0.6 \leq x \leq 0.9$ $0 \leq y \leq 0.4$ $0 \leq z \leq 0.3$ or a Co-rich film of formula $$Ni_{x'}Co_{y'}Fe_{z'}$$

in which $0 \leq x' \leq 0.4$ $0.2 \leq y' \leq 0.95$ $0 \leq z' \leq 0.5$.

When an insulating material is used as the nonmagnetic layer 12 between the free layer 13 and the fixed layer 19, oxide such as $Al_2O_3$, MgO or carbide and nitride are excellent. Particularly in the case of nitride, MN(O) is preferable. (Here, M is at least one kind selected from Al, B and In. In addition, (O) shows oxygen incorporation.) Alternatively, a wide-gap semiconductor having an energy gap value of 2–6 eV also is preferable.

Furthermore, the resistance of the magneto-resistive effect device is dependent on the thickness of the nonmagnetic substance acting as an insulating material. For the operation as a magneto-resistive device, the thickness thereof needs to be determined in the range of about 0.5 nm to 5 nm. In other words, the magneto-resistive effect device can achieve a desired value of resistance by controlling the thickness of the nonmagnetic substance.

Furthermore, when metal is used as the nonmagnetic layer 12 between the free layer 13 and the fixed layer 19, it is possible to use Cu, Ag, Au, Ru etc., but particularly Cu is excellent. The thickness of the nonmagnetic layer is required to be at least not less than 0.9 nm for weakening the interaction between the magnetic layers. Moreover, the thickness thereof should be determined to be not more than 10 nm, preferably not more than 3 nm, since the MR ratio is reduced when the thickness is increased. Moreover, in the case where the thickness of this nonmagnetic layer is not more than 3 nm, the flatness of the respective layers is important. If the flatness is unsatisfactory, a magnetic bonding arises between the two magnetic layers 13, 11 or 13, 19 which should be magnetically separated by the nonmagnetic layer, so that the MR ratio is deteriorated and the sensitivity is reduced. Therefore, it is preferable that the unevenness of the interface between the magnetic layer and the nonmagnetic layer is not more than 0.5 nm.

EXAMPLE

In the following, further specific examples will be explained.

Example 1

Figure 9:
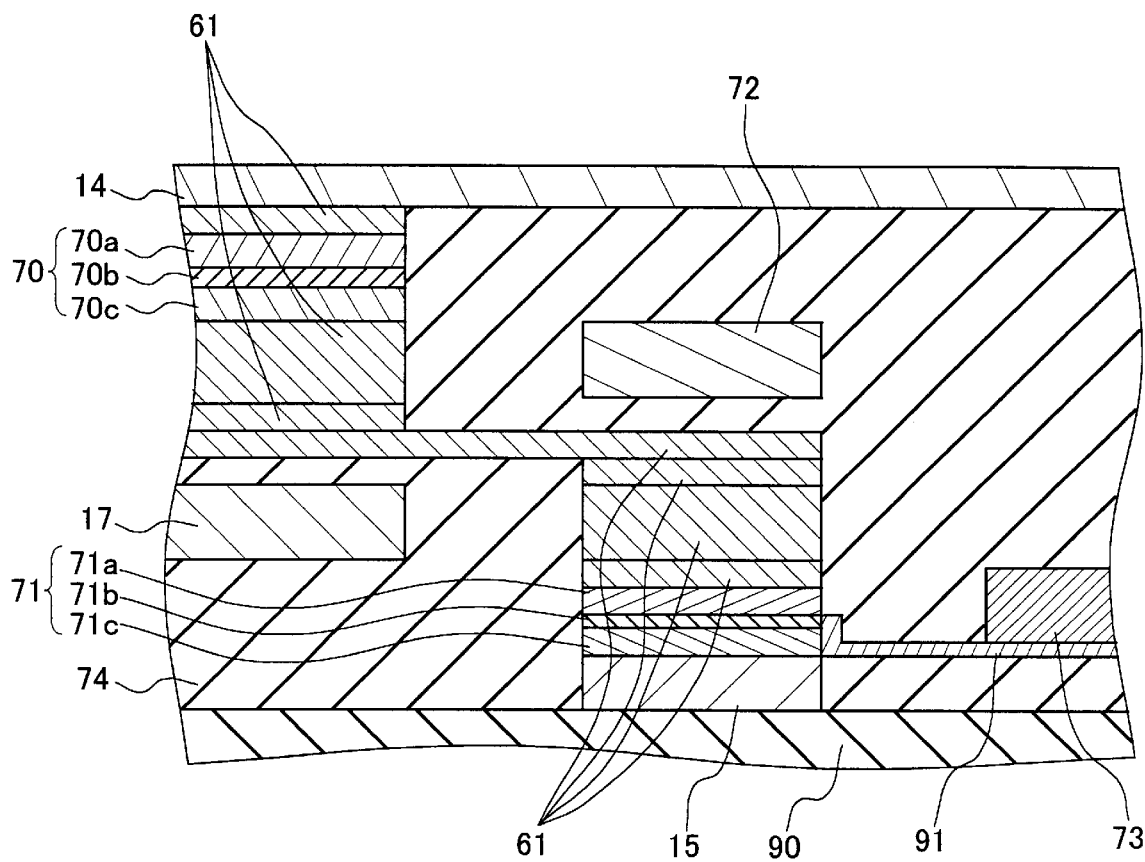
FIG. 9 is a schematic block diagram of a storage device according to one embodiment of the present invention.

On a substrate that is provided in advance with a conductive portion to be used as a contact portion for a bit line, by using the techniques of photolithography, dry etching and polish-flattening with a multiple sputter equipment, a magneto-resistive effect type storage device having a cross-sectional configuration shown in FIG. 9 was produced.

The part of the storage device includes two magneto-resistive devices 70, 71 formed on a substrate 90. As for the one magneto-resistive device 71, $Ni_{0.68}Co_{0.12}Fe_{0.12}$ was used as a soft magnetic film 71c for a free layer, and $Co_{0.75}Pt_{0.25}$ was used as a hard magnetic film 71a for a fixed layer. Cu was used as a nonmagnetic conductive film 71b. Cu of the nonmagnetic conductive film 71b is drawn also as an electrode 91 and is connected to a contact layer 61 or to a resistance 73 produced at the same time when a word electrode substance 17 for the other magneto-resistive device 70 is produced. Furthermore, Pt, Au, Cu, Al, AuCr, Ti/Au, Ta/Pt or Cr/Cu/Pt/Ta etc. was used for the contact electrode or the conductive film 61 of a sense line, and Al, AuCr, Ti/Au, Ta/Pt or Cr/Cu/Pt/Ta etc. was used for the conductive films 17, 72 for word lines. As for each interlayer insulating layer 74, $Al_2O_3$, $CaF_2$, $SiO_2$, or $Si_3N_4$ etc. was used to achieve electrical isolation.

As for the other magneto-resistive device 70, a TMR type device was arranged, and a magneto-resistive device of NiFe(20)/CoFe(4)/$Al_2O_3$(1.2)/CoFe(4)/IrMn(20) (the thickness (nm) is shown in brackets) was produced from target materials of $Co_{0.9}Fe_{0.1}$, Al, $Co_{0.5}Fe_{0.5}$, IrMn, $Ni_{0.8}Fe_{0.2}$ (all compositions shown in atomic ratios) by the sputtering method.

Here, $Al_2O_3$ of the nonmagnetic insulating layer 70b was prepared by forming a film of Al and then carrying out an oxidization process. With regard to the oxidation process, the oxidation was performed by natural oxidation inside a vacuum chamber, by natural oxidation with heat applied inside a vacuum chamber, or by plasma oxidation inside a vacuum chamber. It was confirmed that excellent nonmagnetic insulating films could be obtained in any of the above processes.

In the present embodiment, the method by natural oxidation with heat applied inside a vacuum chamber was employed. Furthermore, the thicknesses of the nonmagnetic insulating layers (12a, 70b) are required to be 0.3 nm or larger in order to secure insulation. It is preferable to determine the thicknesses to be not more than 3 nm because the tunnel current does not flow if the nonmagnetic insulating layers (12a, 70b) become too thick. The thicknesses of the nonmagnetic insulating layers (12a, 70b) at this time are directly related to the resistance of the device, so that these thicknesses should be adjusted and manufactured according to the desired device resistance. However, also in this case, it is important that each layer remains flat. If the flatness deteriorates, either the nonmagnetic insulating layers (12a, 70b) are broken so as to cause tunnel leaks or a magnetic bonding is generated between the two ferromagnetic films (13 and 19, 70a and 70c) so as to deteriorate the MR ratio in the MR device portion (21, 70) and also the sensitivity. Therefore, the unevenness of the interface between the respective ferromagnetic films and the nonmagnetic insulating films preferably is not more than 0.5 nm, and more preferably not more than 0.3 nm.

As a result of measuring the MR property of the single TMR device at room temperature and in an applied magnetic field of 40 Oe, the MR ratio was about 36%. A junction area at this time was produced of about 0.5 μm in length and 1.5 μm in width.

A bias current was applied with a constant current from the sense line 14 to the sense line 15, and a measurement was carried out. As a result, when the magnetization directions of the two ferromagnetic substances of the second magneto-resistive device 71 are parallel to each other, a resistance change according to the parallelism or the anti-parallelism of the magnetization direction of the first magneto-resistive device 70 was detected. In other words, it is clear that, by corresponding the parallelism and the anti-parallelism to "0" and "1", the storage was read out successfully. First, an electric current was supplied to the word line 17 to magnetize the SM film of the first magneto-resistive device in one direction. Next, a current pulse is applied also to the word line 17 to monitor the voltage change of the storage device measured through the sense line. The output change of information stored in the first magneto-resistive device 70 in accordance with the positive and the negative of the current pulse applied to the word line could be detected. It was confirmed that the arranged magneto-resistive device 70 operates as a storage device.

Next, an electric current was supplied to the word line 72 to change the magnetization directions of the two magnetic films of the second magneto-resistive device 71 to anti-parallelism. In this case, the output to be detected was reduced from the output at the time of parallelism. This fact shows that, in the case of anti-parallelism, the applied current was split in the direction of the LR device 73. In the present embodiment, load resistance of 1 to 10Ω was used for the LR part.

In other words, as a result of this operation, it is possible to achieve the state in which the storage device in the former step can be read when the magnetization directions of the magneto-resistive devices in the subsequent stage are in the parallel state, whereas the storage device in the former step cannot be read easily when the magnetization directions of the magneto-resistive devices in the subsequent stage are in the non-parallel state. Thus, the magneto-resistive effect type storage device of the present invention could be realized.

Consequently, with regard to the output from the storage device of the magneto-resistive device in the former step, the path of this output is divided by the resistance change of the magneto-resistive device in the subsequent stage, so that the reading of information from the storage device can be performed selectively.

Embodiment 2

On a substrate that is provided in advance with a conductive portion to be used as a lower electrode contact, a hole for the contact was disposed in an interlayer insulating layer formed by accumulating $Al_2O_3$ or $SiO_2$, and on top thereof, a layer of a SiC polycrystal film was formed by directly sputtering SiC in an atmosphere of Ar. The substrate was produced at 200 to 750° C. with the sputtering power of 400 to 500W. Also, this SiC layer can be formed by Si thermal evaporation in an atmosphere of $C_2H_2$. On the surface thereof, an insulating layer was further provided, and after a contact portion is placed in a desired position, the contact portion was formed by copper plating and then flattened to form a varistor device portion. The property of the varistor type device portion was adjusted by controlling the grain growth or the grain-boundary bonding condition of the film made of a polycrystalline substance.

Furthermore, with a multiple sputter equipment, a magneto-resistive device portion was produced. For a magneto-resistive device, a TMR type device was arranged, and a magneto-resistive device of NiFe(20)/CoFe(4)/$Al_2O_3$ (1.2)/CoFe(4)/IrMn(20) (the thickness (nm) is shown in brackets) was produced from target materials of $Co_{0.9}Fe_{0.1}$, Al, $Co_{0.5}Fe_{0.5}$, IrMn, $Ni_{0.8}Fe_{0.2}$ (all compositions shown in atomic ratios) by the sputtering method.

Here, $Al_2O_3$ of the nonmagnetic insulating layer was prepared by forming a film of Al and then carrying out an oxidization process. With regard to the oxidation process, the oxidation was performed by natural oxidation inside a vacuum chamber, by natural oxidation with heat applied inside a vacuum chamber, or by plasma oxidation inside a vacuum chamber. It was confirmed that excellent nonmagnetic insulating films could be obtained in any of the above processes. In the present embodiment, the method by natural oxidation with heat applied inside a vacuum chamber was employed. As a result of measuring the MR property of the device at room temperature and in an applied magnetic field of 40 Oe, the MR ratio was about 36%. A junction area at this time was about 0.5 μm in length and 1.5 μm in width.

A magneto-resistive device processed and manufactured by using such a film was used to construct and produce a single storage cell as illustrated in the schematic drawing of FIG. 6, and the confirmation of operation was performed with a driving voltage. The part of the storage device is constructed by connecting the magneto-resistive device and the varistor type device in series. Pt, Cu or Au was used for the conductive film for a sense line, and Al, Cu, AuCr, Ti/Au, Ta/Pt or Cr/Cu/Pt/Ta etc. was used for the conductive film for a word line. In order to insulate the storage device from the word line, $Al_2O_3$, $CaF_2$, $SiO_2$, or $Si_3N_4$ etc. was used.

FIG. 10 shows the state in which a voltage bias is applied to the manufactured storage cell. The selected storage cell of the S-type is biased at a point S that is higher than the varistor voltage, so that a desired output voltage could be secured.

Other non-selected storage cells (See FIG. 7) of the U-type, the V-type and the O-type were biased respectively at points U, V and O. In any case, the cells were not biased above the varistor voltage where the resistance is reduced drastically, so that it became clear that the output from the storage cells is not affected thereby.

Accordingly, as a result of constructing a MRAM device by using the magneto-resistive effect type storage device of the present invention, the selectivity of storage cells can be improved, and the S/N of the MRAM device can be improved.

Embodiment 3

On a substrate that is provided in advance with a conductive portion to be used as a contact portion for a bit line, by using the techniques of photolithography, dry etching and polish-flattening with a multiple sputter equipment, a magneto-resistive effect type storage device shown as an equivalent circuit in FIG. 11 was produced.

The part of the storage device includes two magneto-resistive devices, and one of the magneto-resistive devices arranged in the lower part is a TMR type device of NiFe (20)/CoFe(4)/Al$_2$O$_3$(1.2)/CoFe(4)/IrMn(20) (the thickness (nm) is shown in brackets), which was produced from target materials of Co$_{0.9}$Fe$_{0.1}$, Al, Co$_{0.5}$Fe$_{0.5}$, IrMn, Ni$_{0.8}$Fe$_{0.2}$ (all compositions shown in atomic ratios) by the sputtering method.

Furthermore, in this configuration, the varistor resistance device was connected in parallel to this magneto-resistive device. By arranging load resistance in the subsequent stage of the magneto-resistive device, the resistance was raised to nearly the varistor voltage, and according to the magneto-resistive value, the varistor type device is configured to have bias points above and below the varistor voltage.

Here, Pt, Cu or Au etc. was used for the contact electrode or the conductive film for a sense line, and Al, Cu, AuCr, Ti/Au, Ta/Pt or Cr/Cu/Pt/Ta etc. was used for the conductive film for a word line. As for each interlayer insulating layer, Al$_2$O$_3$, CaF$_2$, SiO$_2$ or Si$_3$N$_4$ etc. was used to achieve isolation.

Another magneto-resistive device arranged in the upper part also is a TMR type device of NiFe(20)/CoFe(4)/Al$_2$O$_3$(1.2)/CoFe(4)/IrMn(20) (the thickness (nm) is shown in brackets), which was produced from the target materials of Co$_{0.9}$Fe$_{0.1}$, Al, Co$_{0.5}$Fe$_{0.5}$, IrMn, Ni$_{0.8}$Fe$_{0.2}$ (all compositions shown in atomic ratios) by the sputtering method.

Here, Al$_2$O$_3$ of the nonmagnetic insulating layer was prepared by forming a film of Al and then carrying out an oxidization process. With regard to the oxidation process, the oxidation was performed by natural oxidation inside a vacuum chamber, by natural oxidation with heat applied inside a vacuum chamber, or by plasma oxidation inside a vacuum chamber. It was confirmed that excellent nonmagnetic insulating films could be obtained in any of the above processes.

As a result of measuring the MR property of the single TMR device at room temperature and in an applied magnetic field of 40 Oe, the MR ratio was about 36%. A junction area at this time was produced of about 0.5 μm in length and 1.5 μm in width.

In the present device, a bias current was applied from the sense line 14 to the sense line 15 by biasing with a constant current, and the confirmation of operation was performed. As a result of measuring the operation, when the magnetization directions of the two ferromagnetic substances in the magneto-resistive device 71 in the lower part were parallel to each other, the resistance change according to the parallelism or the anti-parallelism of the magnetization direction of the first magneto-resistive device 70 in the upper part was detected.

Next, an electric current was supplied to the word line 72 to change the magnetization directions of the two magnetic films of the second magneto-resistive device 71 to anti-parallelism. In this case, it was confirmed that the current was split largely to the side of the varistor type device. Consequently, it was confirmed that the bias applied to the storage cell can be controlled by the magneto-resistive type storage device of the present invention.

Embodiment 4

As a resistive device showing strong nonlinearity (See 60 in FIG. 6A), a tunnel device (M-I-M) was used to configure and produce a single storage cell as illustrated in FIG. 6A, and the confirmation of operation was performed with a driving voltage. The magneto-resistive device was created according to the configuration described in Embodiment 2. Here, as the M-I-M device, Al—Al$_2$O$_3$—Au was used.

Figure 13:
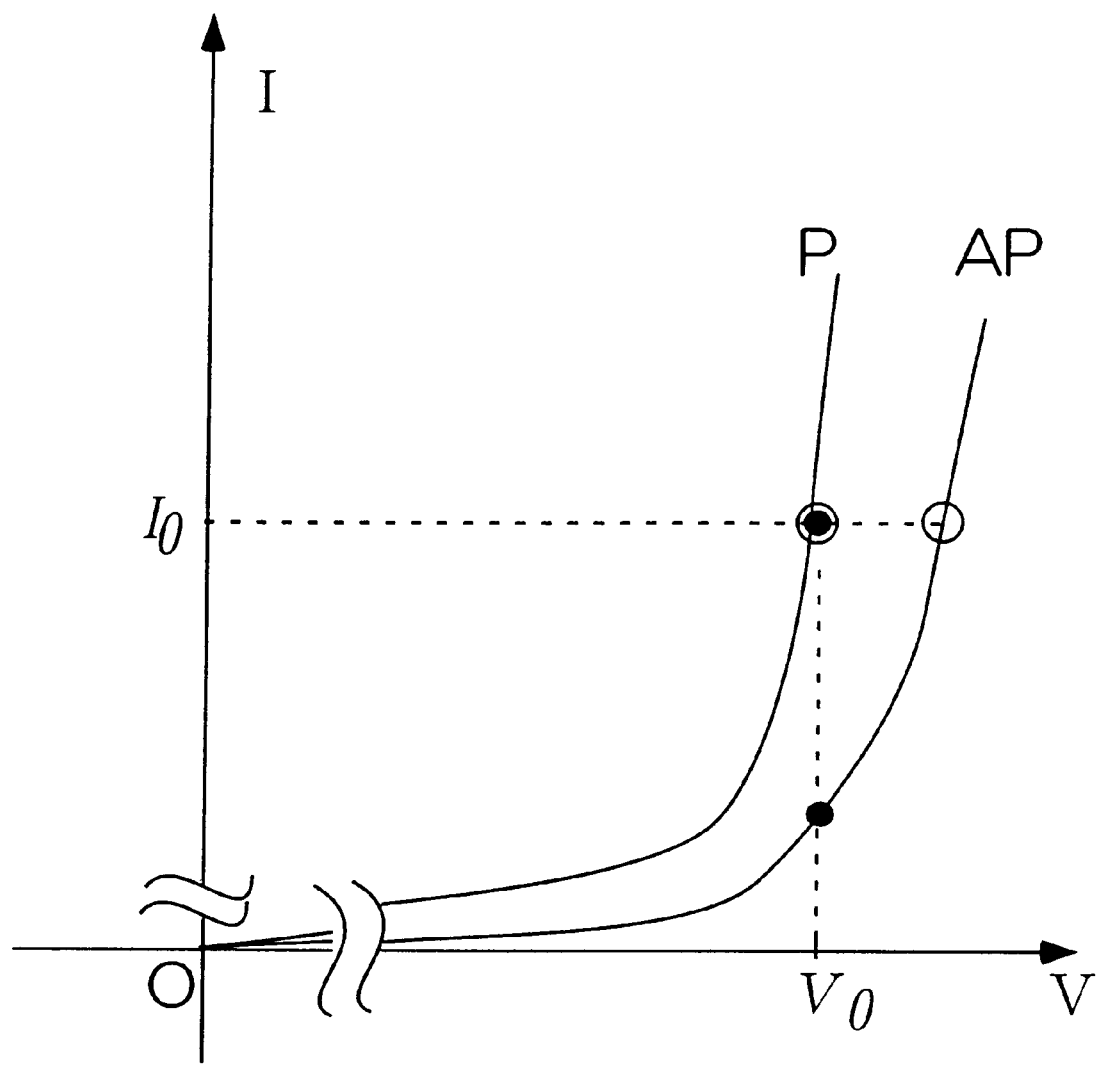
FIG. 13 is a graph showing basic characteristics of a storage device according to one embodiment of the present invention.

FIG. 13 shows the state in which the magnetic resistance changes under the voltage bias applied to the manufactured storage cell. It is shown how the magneto-resistive difference caused by the parallelism (P) and the anti-parallelism (AP) of the magnetization between the fixed layer and the free layer of the first magneto-resistive device 70 can be obtained as an output. FIG. 13 shows the state in which the magneto-resistive effect can be obtained not only as the current change in the case of voltage driving but also as the voltage change in the case of current driving.

Accordingly, as a result of constructing a MRAM device by using the magneto-resistive effect type storage device of the present invention, the selectivity of storage cells can be improved, and the S/N ratio of the MRAM device can be improved.

The magneto-resistive device used in the embodiments is not limited to the TMR type device, and a GMR type device also can be used.

Furthermore, by constructing a MRAM device with the magneto-resistive effect type storage device of the present invention shown in the above embodiments, the MRAM device with excellent cell selectivity can be constructed.

As described above, according to the present invention, an effective magneto-resistive effect type storage device capable of controlling the bias applied to the magneto-resistive device can be achieved, which has excellent selectivity of magnetic storage cells when arranged in lines for constructing an MRAM, and which suppresses the deterioration of the S/N even if the densification of the storage capacity is promoted.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magneto-resistive device comprising:
   a first magneto-resistive element comprising a first free layer, a first nonmagnetic layer, and a first fixed layer laminated together in this order;
   a second magneto-resistive element comprising a second free layer, a second nonmagnetic layer, and a first fixed layer laminated together;
   a first conductive film for generating a magnetic field to cause a magnetization rotation of the first free layer; and
   a second conductive film for generating a magnetic field to cause a magnetization rotation of the second free layer;

wherein the first magneto-resistive element and the second magneto-resistive element are electrically connected in series by a conductive film between the first magneto-resistive element and the first conductive film and between the second magneto-resistive element and the second conductive film; and magnetic resistance of the first and second magneto-resistive elements can be controlled independently from each other by applying current separately to the first conductive film and the second conductive film.

2. A magneto-resistive device comprising:
a first magneto-resistive element comprising a first free layer, a first nonmagnetic layer, and a first fixed layer laminated together in this order;
a second magneto-resistive element comprising a second free layer, a second nonmagnetic layer, and a second fixed layer laminated together;
a first conductive film for generating a magnetic field to cause a magnetization rotation of the first free layer;
a second conductive film for generating a magnetic field to cause a magnetization rotation of the second free layer; wherein the first magneto-resistive element and the second magneto-resistive element are connected in series; and
the non-magnetic layer of one of the magneto-resistive elements selected from the first and second magneto-resistive elements is an electrical insulator, and the nonmagnetic layer of the other magneto-resistive element is a conductive substance.

3. A magneto-resistive device comprising:
a first resistive element and a second resistive element connected in series, wherein one of the resistive elements selected from the first and second resistive elements is a magneto-resistive element and the other resistive element is a SiC polycrystal varistor element having non-linear current-voltage characteristics.

4. A magneto-resistive device comprising:
a first magneto-resistive element;
a second magneto-resistive element; and
a resistive element having nonlinear current-voltage characteristics;
wherein the first magneto-resistive element and the second magneto-resistive element are connected in series;
the first magneto-resistive element and the resistive element having non-linear current-voltage characteristics are connected in series;
the second magneto-resistive element and the resistive element having nonlinear current-voltage characteristics are connected in parallel; and
magnetic resistance of the first and second magneto-resistive elements can be controlled independently from each other.

5. The magneto-resistive device according to claim 4, wherein the resistive element having nonlinear current-voltage characteristics is a varistor type element.

6. The magneto-resistive device according to claim 5, wherein the varistor type element is a SiC polycrystal varistor element.

7. The magneto-resistive device according to claim 4, wherein the resistive element having nonlinear current-voltage characteristics is at least one element selected from the group consisting of an interband tunnel effect element, a resonance tunnel effect element, a single electron tunnel effect element and a Josephson effect element.

8. A magneto-resistive effect type storage device comprising a plurality of magneto-resistive devices arranged two-dimensionally or three-dimensionally;
each of the magneto-resistive devices serving as a single storage element, and comprising:
a first magneto-resistive element comprising a first free layer, a first nonmagnetic layer, and a first fixed layer laminated together in this order;
a second magneto-resistive element comprising a second free layer, a second nonmagnetic layer, and a second fixed layer laminated together;
a first conductive film for generating a magnetic field to cause a magnetization rotation of the first free layer; and
a second conductive film for generating a magnetic field to cause a magnetization rotation of the second free layer;
wherein the first magneto-resistive element and the second magneto-resistive element are electrically connected in series by a conductive film between the first magneto-resistive element and the first conductive film and between the second magneto-resistive element and the second conductive film; and
magnetic resistance of the first and second magneto-resistive elements can be controlled independently from each other by applying current separately to the first conductive film and the second conductive film.

9. A magneto-resistive effect type storage device comprising a plurality of magneto-resistive devices arranged two-dimensionally or three-dimensionally;
each of the magneto-resistive devices serving as a single storage element, and comprising:
a first magneto-resistive element comprising a first free layer, a first nonmagnetic layer, and a first fixed layer laminated together in this order;
a second magneto-resistive element comprising a second free layer, a second nonmagnetic layer, and a second fixed layer laminated together;
a first conductive film for generating a magnetic field to cause a magnetization rotation of the first free layer; and
a second conductive film for generating a magnetic field to cause a magnetization rotation of the second free layer;
wherein the first magneto-resistive element and the second magneto-resistive element are connected in series, and
the nonmagnetic layer of one of the magneto-resistive elements selected from the first and second magneto-resistive elements is an electrical insulator, and the nonmagnetic layer of the other magneto-resistive element is a conductive substance.

10. A magneto-resistive effect type storage device comprising a plurality of magneto-resistive devices arranged two-dimensionally or three-dimensionally;
each of the magneto-resistive devices serving as a single storage element, and comprising a first resistive element and a second resistive element connected in series, wherein one of the resistive elements selected from the first and second resistive elements is a magneto-resistive element and the other resistive element is a SiC polycrystal varistor element having nonlinear current-voltage characteristics.

11. A magneto-resistive effect type storage device comprising a plurality of magneto-resistive devices arranged two-dimensionally or three-dimensionally;
each of the magneto-resistive devices serving as a single storage element, and comprising:
a first magneto-resistive element;
a second magneto-resistive element; and a resistive element having nonlinear current-voltage characteristics;

wherein the first magneto-resistive element and the second magneto-resistive element are connected in series;

the first magneto-resistive element and the resistive element having non-linear current-voltage characteristics are connected in series;

the second magneto-resistive element and the resistive element having nonlinear current-voltage characteristics are connected in parallel; and magnetic resistance of the first and second magneto-resistive elements can be controlled independently from each other.

12. The magneto-resistive effect type storage device according to claim 11, wherein the resistive element having nonlinear current-voltage characteristics is a varistor type element.

13. The magneto-resistive effect type storage device according to claim 12, wherein the varistor type element is a SiC polycrystal varistor element.

14. The magneto-resistive effect type storage device according to claim 11, wherein the resistive element having nonlinear current-voltage characteristics is at least one element selected from the group consisting of an interband tunnel effect element, a resonance tunnel effect element, a single electron tunnel effect element and a Josephson effect element.

15. The magneto-resistive device according to claim 2, wherein the electrical insulator comprises at least one of a metal oxide, a metal carbide, and a metal nitride.

16. The magneto-resistive device according to claim 15, wherein the electrical insulator comprises the metal nitride.

17. The magneto-resistive device according to claim 16, wherein the metal nitride is represented by a chemical formula MN(O), where M is at least one element selected from Al, B and In, and O shows oxygen incorporation.

18. The magneto-resistive device according to claim 2, wherein the conductive substance comprises a metal.

19. The magneto-resistive device according to claim 18, wherein the metal is copper.

* * * * *

UNITED STATES PATENT AND TRADEMARK OFFICE
CERTIFICATE OF CORRECTION

PATENT NO. : 6,538,297 B2
DATED : March 25, 2003
INVENTOR(S) : Odagawa et al.

It is certified that error appears in the above-identified patent and that said Letters Patent is hereby corrected as shown below:

<u>Column 14,</u>
Lines 60-61, "and a first fixed layer" should read -- and a second fixed layer --

<u>Column 15,</u>
Line 22, the word "wherein" should begin a new paragraph.

Signed and Sealed this

Thirtieth Day of March, 2004

JON W. DUDAS
*Acting Director of the United States Patent and Trademark Office*